United States Patent [19]

Kingery

[11] Patent Number: 4,509,202
[45] Date of Patent: Apr. 2, 1985

[54] FULL-WAVE RECTIFICATION OF SIGNALS GENERATED BY RADIO FREQUENCY TRANSMITTING CIRCUITS

[76] Inventor: William L. Kingery, P.O. Box 12554, Cincinnati, Ohio 45212

[21] Appl. No.: 500,979

[22] Filed: Jun. 3, 1983

Related U.S. Application Data

[63] Continuation-in-part of Ser. No. 249,197, Mar. 30, 1981, abandoned, which is a continuation-in-part of Ser. No. 135,729, Mar. 31, 1980, abandoned, which is a continuation of Ser. No. 894,745, Apr. 10, 1978, abandoned.

[51] Int. Cl.³ .............................................. H04B 1/02
[52] U.S. Cl. ..................... 455/108; 455/116; 332/47
[58] Field of Search ............ 455/91, 46, 108, 109, 455/116; 332/38, 43 B, 44, 45, 47

[56] References Cited

U.S. PATENT DOCUMENTS 2,271,078  1/1942  Kannenberg ................. 332/43 B
4,220,830  9/1980  Schafer ............................ 455/109

OTHER PUBLICATIONS

Radio Amateur's Handbook, pp. 17, 110–111, 1976, 53rd Edition.

Primary Examiner—Jin F. Ng
Attorney, Agent, or Firm—Wood, Herron & Evans

[57] ABSTRACT

A rectifier, preferably a bridge rectifier, is connected in series between a radio frequency (RF) signal generator and audio signal generator, and an antenna included in an RF signal transmitting circuit for rectifying the signal generated by the transmitting circuit before transmission. In the case of an amplitude modulation (AM) transmitting circuit, relatively low percentage modulation causes the rectifier to operate in a linear range and results in relative intensification of the power in the sidebands of the AM signal, whereby the ratio of the sideband power to the carrier power is increased which means that a relatively greater amount of power is applied to transmission of the message-bearing sidebands as compared to the carrier than in conventional AM transmitting circuits. Furthermore, relatively high percentage modulation causes the rectifier to operate in a nonlinear range and results in generation of a detectable angle modulation equivalent signal which has the advantage over conventional angle modulation transmitting circuits that a carrier is not transmitted when there is no modulating signal.

1 Claim, 18 Drawing Figures

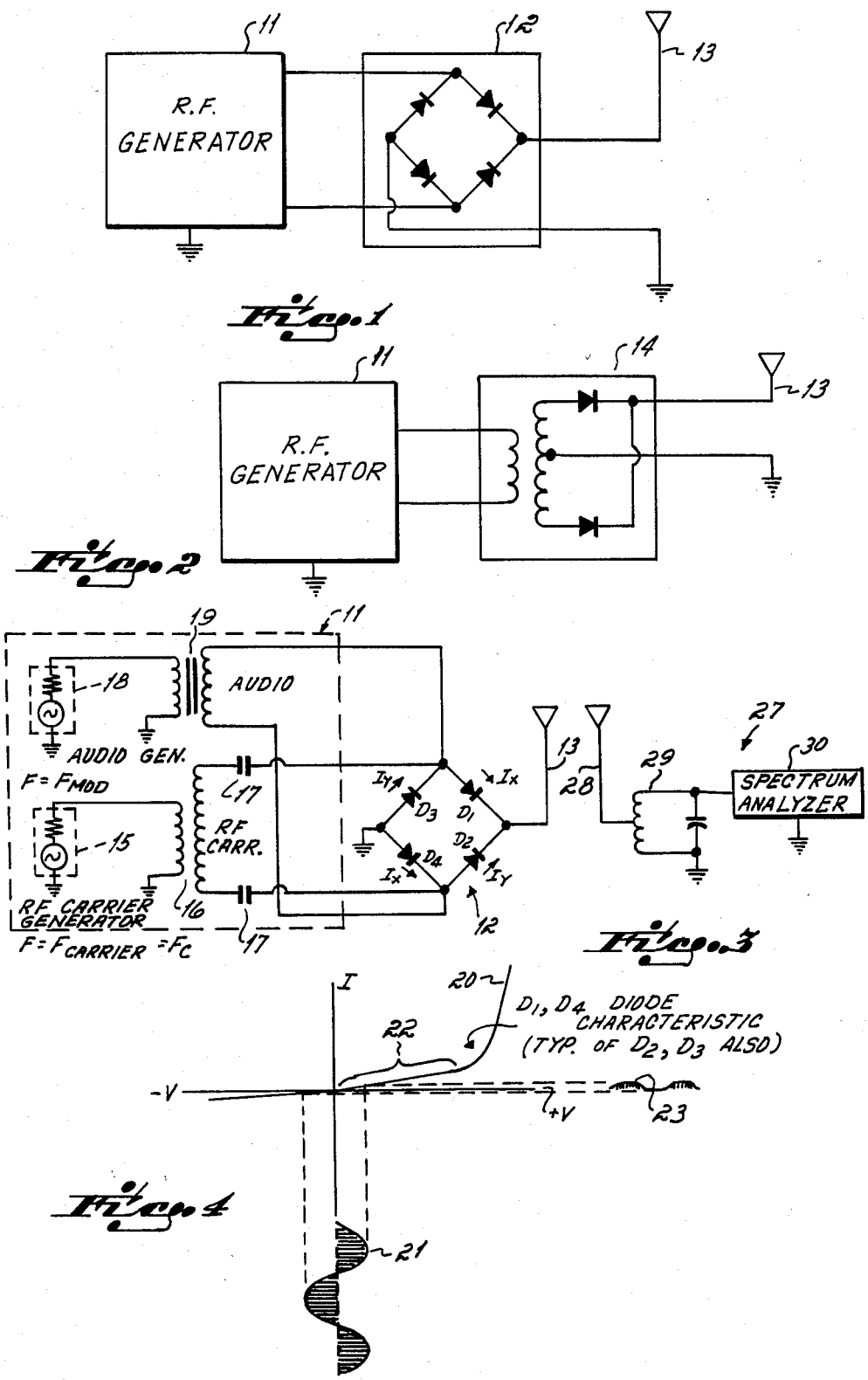

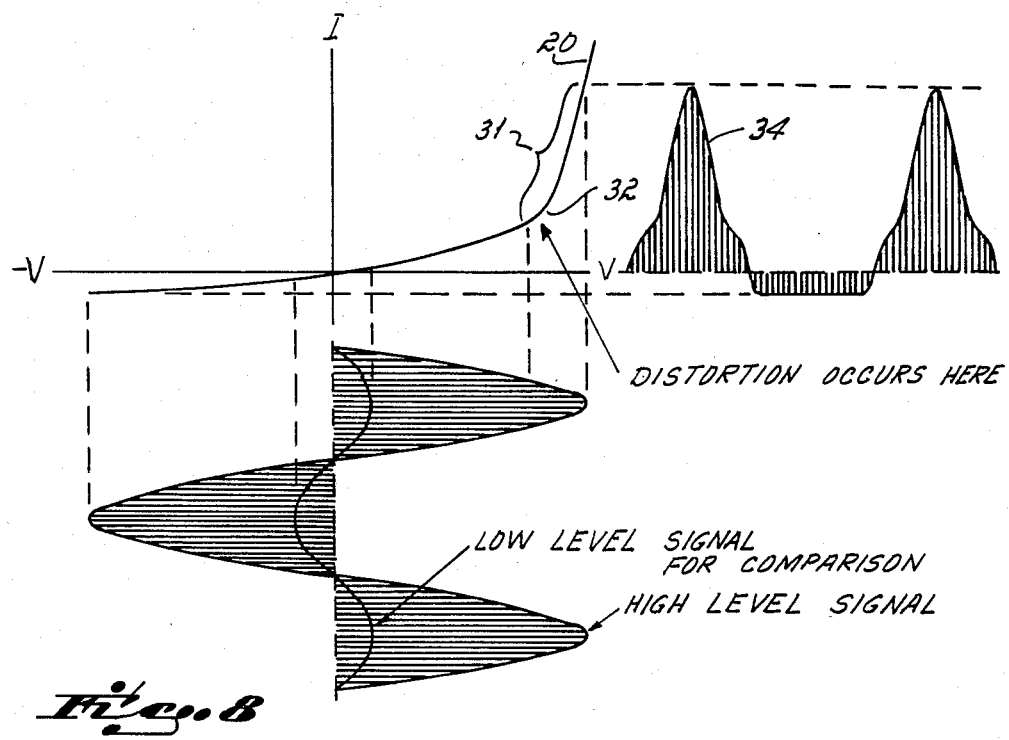
FIG. 8
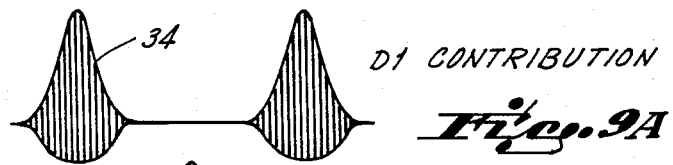
D1 CONTRIBUTION FIG. 9A
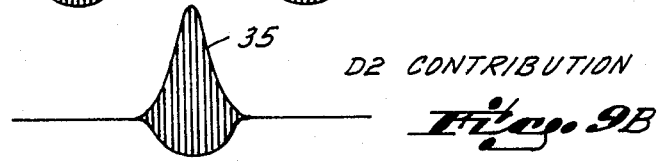
D2 CONTRIBUTION FIG. 9B
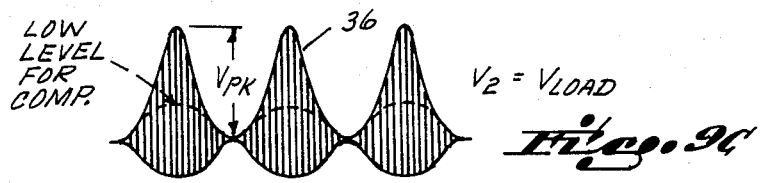
$V_2 = V_{LOAD}$ FIG. 9C

FULL-WAVE RECTIFICATION OF SIGNALS GENERATED BY RADIO FREQUENCY TRANSMITTING CIRCUITS

DESCRIPTION OF THE INVENTION

Cross References to Related Patent Applications

This application is a continuation-in-part of application Ser. No. 249,197, filed Mar. 30, 1981 now abandoned, which was a continuation-in-part of application Ser. No. 135,729, filed Mar. 31, 1980, and now abandoned, which was a continuation of application Ser. No. 894,745, filed Apr. 10, 1978, now abandoned.

BACKGROUND OF THE INVENTION

This invention relates to radio frequency (RF) transmitting systems. More particularly, this invention is directed to the improvement in RF transmitting circuits which comprises a full-wave or bridge rectifier connected in series between (a) an RF signal generator coupled in parallel with an audio signal generator and (b) an antenna, whereby the full-wave rectifier serves to modulate the output of the RF signal generator with the output of the audio signal generator to produce a modulated, full-wave rectified signal to the antenna.

Rectifiers are well known in the art. For example, they are utilized in power supply systems for supplying direct-current (d-c) voltage, in RF detectors, etc. Some prior art examples of rectifier circuits and their uses are found in *The Radio Amateur's Handbook—The Standard Manual of Amateur Radio Communication,* published by the American Radio Relay League, Fifty-Fourth Edition, 1977, incorporated by reference herein.

RF transmitting systems are also well known in the art. The basic principles of RF transmission are set out in Chapter 6 of *The Radio Amateur's Handbook* referred to above.

Communication of messages by RF transmission involves the process of modulation. The broad definition of modulation implies three fundamental concepts: modulating wave, carrier and modulated wave. A modulating wave changes some parameter of the wave to be modulated; a carrier is a wave suitable for modulation by the modulating wave; and, lastly, a modulated wave is a wave, some parameter of which is changed in accordance with the modulating wave. For example, conventional amplitude modulation (AM) is defined as modulation in which the amplitude factor of a sine-wave carrier is linearly proportional to the amplitude of the modulating wave. Analysis shows that an amplitude modulated wave is composed of the carrier, which conveys no information apart from its own particular amplitude, frequency, and phase, plus the familiar upper and lower sidebands, which convey identical and therefore mutually redundant information. An important characteristic of AM transmission is that, apart from a scale factor and constant term, either the upper or lower envelope of the modulated signal is an exact replica of the modulating signal, provided two conditions are satisfied: first, that the carrier frequency exceeds twice the highest modulating signal frequency to be transmitted; and, second, that the carrier is not overmodulated. AM transmission has the advantages that the wave form of the message is preserved and the receiver circuit is relatively simple. However, AM transmission doubles bandwidth occupancy and also requires extra signal power, not only because two sidebands are transmitted, but also because the carrier is transmitted.

Single-sideband, suppressed carrier (SSB) modulation results from elimination of one sideband and reduction or elimination of the carrier of an AM signal. Assuming adequate knowledge of the carrier, the sideband which remains unambiguously defines the message.

Since one of the sidebands and possibly the carrier are eliminated, SSB transmission saves bandwidth occupancy and conserves signal power compared with AM transmission. However, SSB transmission cannot handle low frequencies. Additionally, an inherent delay results in SSB transmission as a consequence of elimination of the unwanted sideband. Furthermore, unlike in the case of AM transmission, the wave form of the wanted message is not preserved, and therefore an SSB receiver circuit is more complex than an AM receiver circuit. Moreover, if the carrier is eliminated prior to transmission, the SSB receiver must include an RF signal generator having the precise frequency and phase of the carrier in order to detect the message.

Angle modulation is defined as modulation in which the angle (entire argument) of a sine-wave carrier is the parameter changed by the modulating wave. Frequency and phase modulation are particular forms of angle modulation. Frequency modulation (FM) is angle modulation in which the instantaneous frequency of the sine-wave carrier is caused to depart from the carrier frequency by an amount proportional to the instantaneous magnitude of the modulating wave. Phase modulation (PM) is angle modulation in which the angle of a sine-wave carrier is caused to depart from the carrier angle by an amount proportional to the instantaneous magnitude of the modulating wave; that is, the linearly increasing angle of the sine-wave carrier has added to it a phase angle proportional to the instantaneous magnitude of the modulating wave. FM and PM are similar in the sense that any attempt to shift frequency or phase is accompanied by a change in the other.

In comparison with AM and SSB transmission, angle modulation transmission reduces noise in exchange for extra bandwidth occupancy and is characterized by constant average signal power and constant peak power that is only twice the average power. Also, angle modulation transmission exhibits a channel-grabbing property whereby if two signals reach the receiver circuit, the larger signal is detected to the near exclusion of the smaller. However, since angle modulation transmission is extravagant of bandwidth occupancy, signal power must be adequate to override wide-band noise. Also, a continuous wave (CW) signal at the carrier frequency is transmitted in the absence of a modulating signal. Furthermore, FM and PM receiver circuits include circuitry for converting frequency or changes in phase, respectively, into amplitude variations and are therefore more complicated than AM or SSB receiver circuits.

SUMMARY OF THE INVENTION

One objective of this invention is to provide an improvement in conventional AM transmitting circuits whereby a relatively greater amount of power is applied to transmission of the message-bearing sidebands as compared to the carrier than in conventional AM transmitting circuits.

Another objective is to provide a modification in conventional AM transmitting circuits whereby a detectable angle modulation equivalent signal can be generated without any effect on the capability of the AM transmitting circuits to generate an AM signal.

The above and other objectives are achieved in accordance with a preferred embodiment of this invention which provides a bridge rectifier connected in series between (a) an RF signal generator coupled in parallel with an audio signal generator and (b) an antenna. The RF signal generator and audio signal generator together form a transmitter signal generating circuit, with the outputs of the two signal generators being connected in parallel across the full-wave bridge rectifier. The full-wave bridge rectifier serves to produce a modulated, full-wave rectified output signal which is coupled to the antenna for transmitting.

In the case of AM transmitting circuits, relatively low percentage modulation causes the rectifier to operate in a linear range and results in relative intensification of the power in the sidebands of the AM signal. Since the ratio of the sideband power to the carrier power is increased, a relatively greater amount of power is applied to transmission of the message-bearing sidebands as compared to the carrier than in conventional AM transmitting circuits. Although the actual percentage of modulation is relatively low, nevertheless, the operation of the rectifier results in detection of an apparent level of modulation which is the equivalent of a relatively high percentage of modulation in conventional AM transmitting circuits.

On the other hand, again in the case of AM transmitting circuits, relatively high percentage modulation causes the rectifier to operate in a nonlinear range and results in generation of a detectable angle modulation equivalent signal. Unlike conventional angle modulation transmitting circuits, no carrier is transmitted in the absence of a modulating signal.

Furthermore, in the case of angle (frequency or phase) modulation transmitting circuits, the rectifier can be connected in series between the modulated RF signal generator and the antenna whereby the rectifier is driven by the angle modulated signal. The frequency effects which occur when the rectifier operates appear to cause reduction of the frequency spectrum occupied by the angle modulated signal. The result of such a reduction is greater separation among adjacent channels assigned for angle modulation transmission.

This invention provides full-wave rectification of signals generated by RF transmitting circuits, preferably utilizing a bridge rectifier. What is accomplished is that there is a relative intensification of the power in the message-bearing sidebands at low modulation levels and the capability for generating angle modulation equivalent signals at higher modulation levels in AM transmitting circuits. Also, the frequency spectrum occupied by angle modulated signals generated by angle modulation transmitting circuits can apparently be reduced.

BRIEF DESCRIPTION OF THE DRAWINGS

The above and other features and the concomitant advantages of full-wave rectification of RF and audio signals in accordance with this invention will be better understood after consideration of the following description of the preferred embodiments which is given in conjunction with the accompanying drawings. In the drawings:

FIG. 1 is a schematic diagram of a circuit for rectifying RF and audio signals in accordance with a preferred embodiment of this invention in which a bridge rectifier is utilized;

FIG. 2 is a schematic diagram of a modified circuit of this invention in which a full-wave rectifier is utilized;

FIG. 3 is a schematic diagram of a circuit for rectifying AM signals;

FIG. 4 illustrates the operation of the circuit shown in FIG. 3 for low percentage modulation;

FIG. 8 illustrates the operation of the circuit shown in FIG. 3 for relatively high percentage modulation;

FIG. 9 illustrates the resultant wave form generated by the circuit shown in FIG. 3 for relatively high percentage modulation;

DESCRIPTION OF THE PREFERRED EMBODIMENTS

Figure 5A:
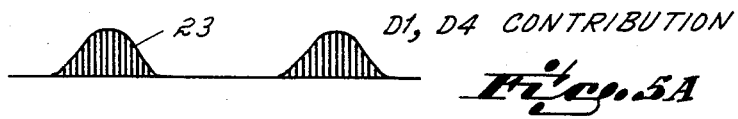
FIG. 5 illustrates the resultant wave form generated by the circuit shown in FIG. 3 for low percentage modulation.

FIG. 1 shows the preferred embodiment for the modulated RF signal full-wave rectification circuit of this invention. As shown in FIG. 1, an RF and audio signal generator 11 is connected to the input of a bridge rectifier 12. The output of bridge rectifier 12 is connected to an antenna 13. The RF and audio signal generated by RF and audio signal generator 11 is rectified by bridge rectifier 12 so that antenna 13 is excited by a full-wave rectified modulated RF signal.

A modification of the circuit shown in FIG. 1 appears in FIG. 2. As shown in FIG. 2, the output of RF and audio signal generator 11 is connected to the input of a full-wave rectifier 14. The output of full-wave rectifier 14 is connected to antenna 13. The RF and audio signal generated by RF signal generator 11 is full-wave rectified by full-wave rectifier 14 before being applied to antenna 13.

The circuit shown in FIG. 1 is preferred to the circuit shown in FIG. 2 for the reason that bridge rectifier 12 has advantages over full-wave rectifier 14. One advantage of bridge rectifier 12 over full-wave rectifier 14 is that with a given input voltage, the bridge rectifier produces an output voltage nearly twice that of the full-wave rectifier. This is because full-wave rectifier 14 includes a center-tap transformer which means that the maximum voltage that can be developed across the load is one-half the given voltage less the small voltage drop across the diode which is conductive. In contrast, the maximum voltage that can be developed across the load in the case of bridge rectifier 12 is the full given voltage less the small voltage drop across the two diodes which are conductive. A second advantage of bridge rectifier 12 is that the peak inverse voltage across each diode is only half the peak inverse voltage impressed across each diode in full-wave rectifier 14 that is designed for the same output voltage. In summary, a greater output voltage is produced, and a greater input voltage can be handled without risk of diode failure, by bridge rectifier 12 than by full-wave rectifier 14.

One example of the modulated RF signal full-wave rectification circuit shown in FIG. 1 appears in FIG. 3. As shown in FIG. 3, RF and audio signal generator 11 is configured for generating an AM signal.

Referring to FIG. 3, the AM signal transmitting circuit which comprises RF and audio signal generator 11 includes an RF carrier signal generator 15 whose output is connected across the input of a radio frequency transformer 16. The output of radio frequency transformer 16 is a-c coupled by capacitors 17 to the input of bridge rectifier 12. Also included in the signal generator 11 shown in FIG. 3 is an audio frequency signal generator 18 coupled to a transformer 19 whose output is connected across the input of bridge rectifier 12. The signal generated by audio frequency signal generator 18 comprises the modulating signal which modulates the RF carrier signal generated by RF carrier signal generator 15. The output of the audio transformer 19 presents a high impedance to the RF carrier signal. Also, the capacitors 17 and the output of the RF transformer 16 present a high impedance to the audio output signal.

Certain modifications may be made to the circuit of FIG. 3. As one example, the outputs of the transformers 16, 19 may be coupled in parallel within the generator 11. As another example, the antenna 13 may be any of a number of practical antenna systems commonly used in radio transmitters. For instance, a load resistance may be coupled from the antenna to ground.

Each of the diodes D1, D2, D3 and D4 which comprise bridge rectifier 12 functions as an electronic switch which turns on and off in response to the audio frequency modulating signal for gating the RF carrier signal to antenna 13. The envelope of the modulated RF signal is a function of the amplitude of the audio frequency modulating signal relative to the current versus voltage characteristics of diodes D1, D2, D3 and D4 of bridge rectifier 12 as will be described in more detail later.

Importantly, there is no suppression of the RF carrier signal which is in contrast to what occurs in diode balanced modulator circuits utilized for generating conventional SSB signals. Also, the amplitude of the audio frequency modulating signal is greater than the RF carrier signal amplitude, and the audio frequency modulating signal, not the carrier signal, drives bridge rectifier 12 which is in direct contrast to how diode balanced modulator circuits for generating SSB signals are operated wherein the amplitude of the RF carrier signal is on the order of ten times the amplitude of the audio frequency modulating signal.

Ideally, each of the diodes D1, D2, D3 and D4 would have zero forward resistance and infinite back resistance. Furthermore, change in the current versus voltage characteristic with varying temperature would be absent.

Point-contact germanium diodes have low forward resistance and high back resistance, even at relatively high frequencies. However, they are rather sensitive to temperature changes, although long-term stability and life expectancy are good. Point-contact silicon diodes have higher resistances, both forward and back, but are less temperature sensitive than corresponding germanium types. Silicon and germanium junction diodes have very good resistive characteristics. Copper oxide diodes are usable up to several megacycles, and noise levels are low. In one illustrative construction of the circuit shown in FIG. 3, each of the diodes D1, D2, D3 and D4 was a type 1N4002.

The operation of the AM signal full-wave rectification circuit shown in FIG. 3 depends on the amplitude of the audio frequency modulating signal and the response of diodes D1–D4 of bridge rectifier 12. In the case where the amplitude of the audio frequency modulating signal is small, that is, for low percentage modulation, diodes D1–D4 of rectifier bridge 12 operate in a linear range, and the bridge rectifier intensifies the power in the sidebands of the AM signal such that the ratio of the sideband power to the carrier power is higher than in the case of a conventional AM signal. As a result, a relatively greater amount of power is applied to transmission of the message-bearing sidebands than the carrier compared with conventional AM transmission.

The operation of the AM signal full-wave rectification circuit shown in FIG. 3 will be better understood in view of the plot which appears in FIG. 4. As shown in FIG. 4, the current versus voltage characteristic for each of the diodes D1, D2, D3 and D4 of bridge rectifier 12 is indicated by the curve 20. The scale of the diode characteristic curve 20, for a typical diode, is exaggerated for applied voltage less than zero in FIG. 4 (and FIG. 8). The curve 21 represents diagrammatically the voltage across each of the diodes D1–D4. The driving wave produced by the signal generator 11 to drive the diodes may be regarded as substantially equal to the relatively small RF voltage superimposed on the relatively larger audio signal. When the amplitude of the audio frequency modulating signal is small, each of the diodes D1, D2, D3 and D4 operates in a linear range indicated by the numeral 22 in FIG. 4.

Figure 5B:
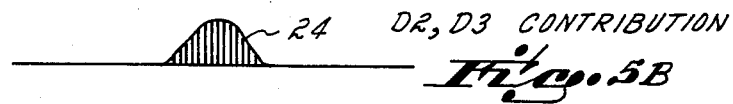

The current through diodes D1 and D4 during positive half cycles of the audio frequency modulating signal is indicated by the curve 23 in FIGS. 4 and 5A. The current through diodes D2 and D3 during negative half cycles of the audio frequency modulating signal can be derived in a manner analogous to that shown in FIG. 4 and is indicated by the curve 24 in FIG. 5B.

Figure 5C:
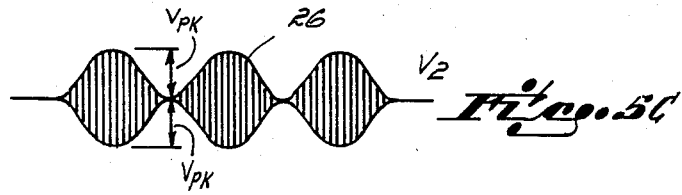

The resultant full-wave rectified AM signal produced by bridge rectifier 12 excites antenna 13. However, excitation of a tuned circuit included in a distant detector causes the full-wave rectified AM signal to be transformed into one which swings equally about the zero-amplitude axis as indicated by the curve 26 in FIG. 5C. Curve 26 resembles the familiar form of an AM signal. Nevertheless, there is an important difference which will now be discussed.

Operation of each of the diodes D1–D4 of the bridge rectifier 12 in the linear range indicated at 22 in FIG. 4 is a consequence of low percentage modulation in the AM transmitting circuit. Due to operation on the diode curves in the generally linear region 22, there is a substantially linear increase in the current through the diodes as the amplitude of the signal driving the bridge rectifier increases.

Referring again to FIG. 3, the full-wave rectified AM signal which excites antenna 13 is transmitted to a detector 27. Detector 27 includes an antenna 28 whose output is connected to the input of a tuned circuit 29. The output of tuned circuit 29 is connected to the input of a spectrum analyzer 30. A Hewlett-Packard Company 8553B spectrum analyzer was utilized for analyzing the result produced by bridge rectifier 12.

Figure 6:
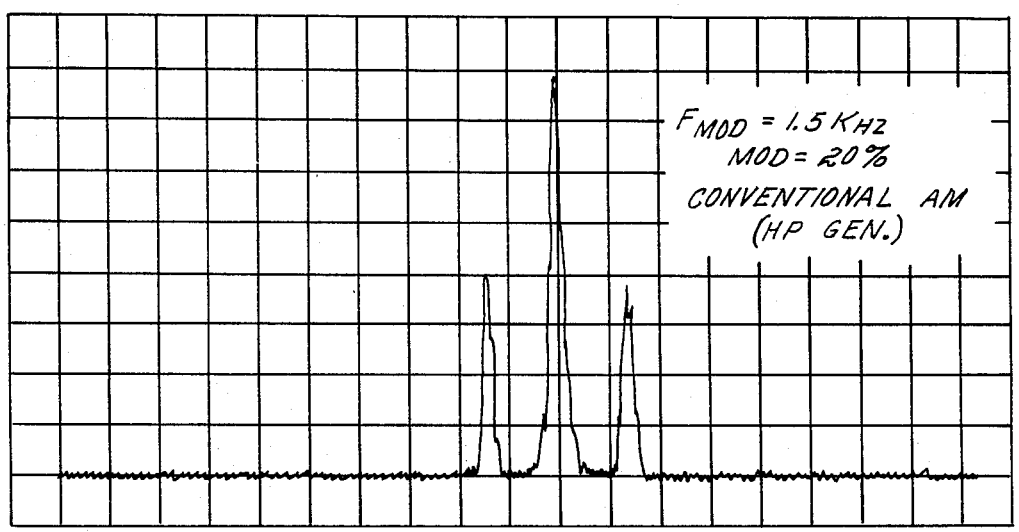
FIG. 6 illustrates a spectrum analyzer trace for a conventional low percentage modulation, single tone AM signal.
Figure 7:
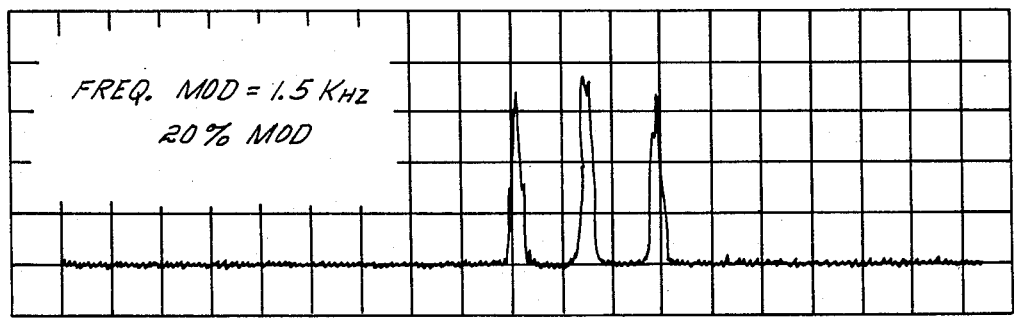
FIG. 7 illustrates a spectrum analyzer trace for a low percentage modulation, signal tone AM signal corresponding to the AM signal shown in FIG. 6 but full-wave rectified before transmission.

FIG. 6 shows the spectrum analyzer trace for a conventional AM signal comprising an RF carrier signal modulated at 20 percent modulation by a single tone (1.5 KHz). Such a signal may be produced using, for example, a conventional RF signal generator. The ratio of the power in each sideband to the carrier power is on the order of 1:2. The spectrum analyzer trace for the corresponding AM signal produced by the transmitter of FIG. 3, that is, an RF carrier signal modulated at 20 percent modulation by a 1.5 KHz. tone, and full-wave rectified, by bridge rectifier 12 before transmission is shown in FIG. 7. The ratio of the power in each sideband to the carrier power is on the order of 1:1.

Since bridge rectifier 12 increases the ratio of the sideband power to the carrier power, a relatively greater amount of power is applied to transmission of the message-bearing sidebands as compared to the carrier than in conventional AM transmitting circuits. Although the actual percentage modulation of the AM signal applied to bridge rectifier 12 is relatively low, for example, 20 percent, nevertheless, the operation of the bridge rectifier results in an apparent amount of modulation which is the equivalent of a relatively high percentage of modulation in conventional AM transmitting circuits.

In view of the curves in FIGS. 4 and 5 and the spectrum analyzer trace in FIG. 7, bridge rectifier 12 seems to respond to the low percentage modulation AM signal in a linear range in such a way that the sideband power is intensified relative to the carrier power, because the bridge rectifier is driven by and is more responsive to the audio frequency modulating signal, which determines the sideband frequencies, rather than the RF carrier signal. The result is that there is enhancement of the power in the sidebands of the AM signal to be transmitted. That is, more energy in the transmitted AM signal is present in the frequency components that contribute to the sidebands than in the carrier.

The frequency spectrum of the AM signal generated by the AM transmitting circuit is similar to a double sideband signal generated by a diode balanced modulator circuit utilized in SSB transmitting circuits except that no carrier cancellation occurs. Diode leakage, frequency effects, which result mainly from shunt capacitance, as will be described in more detail in conjunction with another aspect of this invention, and distortion also prevent the transmitted AM signal from having a closer resemblance to a double sideband signal. As the spectrum analyzer trace illustrated in FIG. 7 indicates, however, distortion at low percentage modulation is so insignificant that the quality of AM transmission is not affected.

The above discussion is concerned with operation of bridge rectifier 12 for low percentage modulation. For relatively high percentage modulation in the AM transmitting circuit, bridge rectifier 12 produces a result which is best analyzed in conjunction with FIGS. 8 and 9A.

Operation of each of the diodes D1, D2, D3 and D4 of bridge rectifier 12 in a nonlinear range indicated by the numeral 31 in FIG. 8 as a consequence of relatively high percentage modulation in the AM transmitting circuit results in a nonlinear increase in the current through the diodes as the amplitude of the audio frequency modulating signal which drives the bridge rectifier is increased to and beyond the level necessary for the knee 32 of curve 20 to be traversed. The current through diodes D1 and D4 during positive half cycles of the audio frequency modulating signal is indicated by the curve 34 in FIGS. 8 and 9A. The current through diodes D2 and D3 during negative half cycles of the audio frequency modulating signal can be derived in a manner analogous to that shown in FIG. 8 and is indicated by the curve 35 in FIG. 9B. The resultant current at the output of bridge rectifier 12 which excites antenna 13 is indicated by the curve 36 in FIG. 9C.

Figure 10:
FIG. 10 illustrates a spectrum analyzer trace for a conventional single tone FM signal.
Figure 11:
FIG. 11 illustrates a spectrum analyzer trace for a full-wave rectified, relatively high percentage modulation AM signal modulated at a tone approximating the single tone which is the modulating signal that produces the FM signal shown in FIG. 10.

In response to high percentage modulation, bridge rectifier 12 produces a result which is best analyzed in conjunction with FIGS. 10 and 11. FIG. 10 shows the spectrum analyzer trace for a conventional FM signal comprising an RF carrier signal modulated by a single tone (1.0 KHz). Such a signal may be produced using, for example, a conventional RF signal generator. The spectrum analyzer trace for an RF carrier signal modulated at 100 percent by a 1.5 KHz tone and full-wave rectified by bridge rectifier 12 before transmission is illustrated in FIG. 11. There is a clear similarity in the overall form of the spectrum analyzer traces shown in FIGS. 10 and 11.

In view of the curves in FIGS. 8 and 9 and the spectrum analyzer trace in FIG. 11, bridge rectifier 12 seems to respond to the relatively high percentage modulation AM signal beyond a linear range into a nonlinear range in such a way that causes distortion. Since a nonlinear transfer characteristic is present, considerable distortion results as diodes D1–D4 of bridge rectifier 12 are driven through conduction knee 32 of the voltage versus current diode characteristic curve 20. The result, however, is the generation of a detectable angle modulation equivalent signal. Unlike conventional angle modulation transmitting circuits, no carrier is transmitted in the absence of an audio frequency signal.

The distortion is evidenced by the presence of additional spectral components, or sidebands, at multiples of the modulating signal frequency, both above and below the RF carrier frequency. As conduction knee 32 of curve 20 is traversed, severe distortion results, but the resultant frequency spectrum shown in FIG. 11 resembles that of an FM signal with modulation indexes of approximately one to two. An angle modulation detector will respond favorably to the angle modulation equivalent signal shown in FIG. 11.

The same results appertain in connection with other forms of AM transmission, such as SSB, vestigial sideband, etc., transmission. That is, relatively low percentage modulation causes the bridge rectifier to operate in a linear range and results in relative intensification of the power in the sidebands of the AM signal, whereas relatively high percentage modulation causes the bridge rectifier to operate through the linear range into the nonlinear range and results in generation of a detectable angle modulation equivalent signal.

In the practice of another aspect of this invention, RF and audio signal generator 11 shown in FIGS. 1 and 2 may alternatively be comprised by an angle modulation transmitting circuit. The frequency effects which occur when bridge rectifier 12 operates at high frequencies appear to cause a reduction of the frequency spectrum occupied by the angle modulated signal. The result of such a reduction is greater separation among adjacent channels assigned for angle modulation transmission as can best be analyzed in conjunction with FIGS. 12-14.

Figure 12:
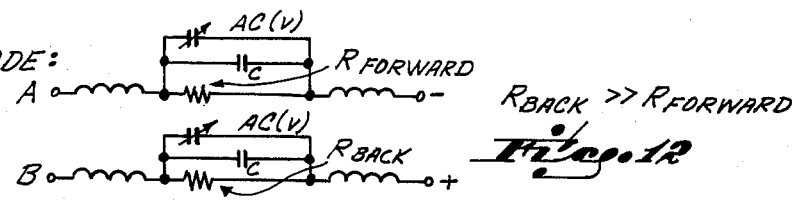
FIG. 12 shows the equivalent circuit for diodes preferably utilized in the circuits shown in FIGS. 1 and 2.

The equivalent circuit for a practical diode is shown in FIG. 12. FIG. 12A shows the equivalent circuit for a diode when the diode is biased in the forward direction. FIG. 12B shows the equivalent circuit for a diode when the diode is biased in the reverse direction. A comparison of the diode equivalent circuits shown in FIGS. 12A and 12B indicates that the only difference resides in the value of the resistance, $R_{FORWARD}$ in the case of forward bias and $R_{BACK}$ in the case of reverse bias. $R_{FORWARD}$ is considerably less than $R_{BACK}$. The shunt capacitance C and C(V) in the equivalent circuit for the diode shown in FIG. 12 is the same whether the diode is forward biased or reverse biased.

As mentioned earlier, the shunt capacitance of a diode is primarily responsible for frequency effects present in the operation of the diode. Such frequency effects cause reduction of the frequency spectrum occupied by the angle modulated signal as best analyzed in conjunction with FIGS. 13 and 14.

Figure 13:
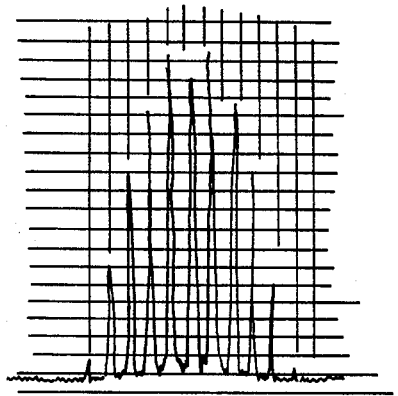
FIG. 13 illustrates a spectrum analyzer trace for a conventional single tone FM signal.
Figure 14:
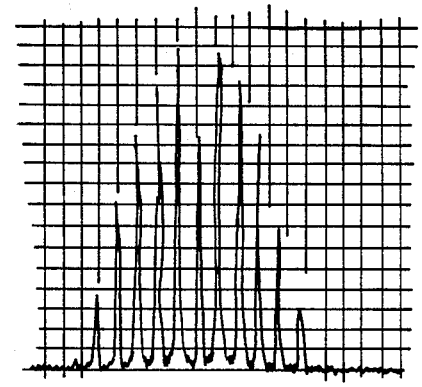
FIG. 14 illustrates a spectrum analyzer trace for a single tone FM signal corresponding to the FM signal shown in FIG. 13 but full-wave rectified before transmission.

FIG. 13 shows the spectrum analyzer trace for a conventional FM signal comprising an RF carrier signal modulated by a single tone (1.5 KHz). The spectrum analyzer trace for the corresponding FM signal full-wave rectified by bridge rectifier 12 before transmission is illustrated in FIG. 14.

The shunt capacitance acts as a bypass for the relatively high frequencies present in the FM signal. On the contrary, the shunt capacitance must be considered in connection with the relatively low frequencies present in the FM signal and affects the deviation from the carrier frequency. Actually, the frequency deviation below the carrier frequency is decreased slightly. As a result, the bandwidth occupancy, that is, the frequency spectrum occupied, below the carrier frequency is reduced as can be seen by a careful comparison of the spectrum analyzer traces in FIGS. 13 and 14. The resultant reduction in the frequency spectrum occupied below the carrier frequency increases the adjacent channel separation from the next lower channel. Minimal distortion is produced and there is no apparent degradation of FM transmission.

PM transmission and FM transmission are not essentially different. A circuit whose output is directly proportional to frequency (zero frequency expected) preceding a frequency modulator converts FM to PM. As a result, reduction of bandwidth occupancy appertains in connection with PM as well as FM.

In the case of AM transmission, the bridge rectifier causes considerably enhanced positive peak modulation of the carrier without significant distortion until the modulating signal which drives the bridge rectifier is increased to a level where the knee of the diode characteristic curve is traversed. At low percentage modulation, defined here as an amount of modulation due to a modulating signal whose maximum amplitude is less than the level which causes the rectifier to operate in a nonlinear region, the bridge rectifier operates to intensify the power in the sidebands. If the amount of modulation is increased, distortion which is less than 30 dB down occurs. In the case of an exemplary construction, such distortion began to occur in the vicinity of modulation above 20-25 percent. Since all intelligence is contained in the sidebands, the resultant increase in the intensity of the sidebands will act and sound as a stronger AM signal at the detector, or receiver. At relatively high percentage modulation, defined here as an amount of modulation due to a modulating signal whose amplitude is sufficient to cause the rectifier to operate in a nonlinear region, the rectifier operates to generate a distortion pattern. The distortion pattern has a frequency spectrum similar to the frequency spectrum of an angle modulated signal. The resultant angle modulation equivalent signal is detectable with an angle modulation detector, or receiver. Significantly, no angle modulation signal is generated in the absence of a modulating signal which means that transmitter power is conserved.

In the case of angle modulation transmission, frequency effects in the rectifier cause reduction of the frequency spectrum below the carrier frequency. The result is greater frequency separation from the next lower assigned channel.

The losses introduced by operation of a bridge rectifier are small. Impedance-matching transformers can be utilized so that the output of the transmitting circuit is optimized.

Various embodiments of the full-wave rectification and modulation circuit of this invention have been described. Other modifications will be obvious to persons skilled in the art that are within the spirit of this invention. In order to appreciate the true scope of this invention, reference must therefore be made to the appended claims.

What is claimed is:

1. A modulated radio frequency signal transmitting circuit comprising:
   a full-wave rectifier circuit, having a pair of input terminals and a pair of output terminals, operable to produce a full-wave rectified signal across the pair of output terminals in response to a signal applied to the pair of input terminals;
   an antenna coupled to a first output terminal of said pair of output terminals of the full-wave rectifier circuit, the second output terminal of said pair of output terminals of the full-wave rectifier circuit being coupled to electrical ground;
   radio frequency signal generating means for producing a radio frequency signal at a pair of output terminals, each output terminal of said pair of output terminals of the radio frequency signal generating means being coupled to a different input terminal of said pair of input terminals of the full-wave rectifier circuit; and
   audio frequency signal generating means for producing an audio frequency signal at a pair of output terminals, each output terminal of said pair of output terminals of the audio frequency signal generating means being coupled to a different input terminal of said pair of input terminals of the full-wave rectifier circuit, the output terminals of the radio frequency signal generating means being connected in parallel with the output terminals of the audio frequency signal generating means, the audio frequency signal generating means producing an audio frequency signal having a greater amplitude than that of the radio frequency signal produced by the radio frequency signal generating means.

* * * * *